United States Patent
Jung

(10) Patent No.: US 7,248,085 B2
(45) Date of Patent: Jul. 24, 2007

(54) INTERNAL RESET SIGNAL GENERATOR FOR USE IN SEMICONDUCTOR MEMORY

(75) Inventor: Won-Chang Jung, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 1 day.

(21) Appl. No.: 11/131,663

(22) Filed: May 17, 2005

(65) Prior Publication Data

US 2005/0258880 A1 Nov. 24, 2005

(30) Foreign Application Priority Data

May 20, 2004 (KR) ...................... 10-2004-0035842

(51) Int. Cl.
*H03L 7/00* (2006.01)
(52) U.S. Cl. ...................... 327/143; 327/198
(58) Field of Classification Search ................ 327/142, 327/143, 198
See application file for complete search history.

(56) References Cited

U.S. PATENT DOCUMENTS

| | | | | |
|---|---|---|---|---|
| 4,716,322 A | * | 12/1987 | D'Arrigo et al. | 327/143 |
| 5,109,163 A | * | 4/1992 | Benhamida | 327/143 |
| 5,166,545 A | * | 11/1992 | Harrington | 327/143 |
| 5,287,011 A | * | 2/1994 | Koshikawa et al. | 327/143 |
| 5,498,989 A | * | 3/1996 | Diba | 327/230 |
| 5,557,579 A | * | 9/1996 | Raad et al. | 365/226 |
| 5,917,255 A | * | 6/1999 | Ciccone | 307/130 |
| 6,111,441 A | * | 8/2000 | Hartley et al. | 327/143 |
| 6,118,315 A | * | 9/2000 | Guedj | 327/143 |
| 6,347,356 B2 | | 2/2002 | Saho | 711/104 |
| 6,407,598 B1 | * | 6/2002 | Ogane | 327/143 |
| 6,686,825 B2 | | 2/2004 | Tamezawa et al. | 336/200 |
| 6,809,565 B2 | * | 10/2004 | Kawakubo | 327/143 |

* cited by examiner

*Primary Examiner*—Kenneth B. Wells
*Assistant Examiner*—Thomas J. Hiltunen
(74) *Attorney, Agent, or Firm*—Marger Johnson & McCollom, P.C.

(57) ABSTRACT

An internal reset signal generator that generates an internal reset disable signal after an internal high voltage device has been completely reset. This can substantially reduce errors in operation of semiconductor memory devices. A first circuit generates a first control signal until the power source voltage reaches a stabilized state and a second control signal thereafter. A delay circuit responds to the first and second control signals and a reset complete signal from a reset circuit, and generates an internal reset disable signal only when the second control signal and the reset completion signal are inputted simultaneously, and in other cases, generates an internal reset signal. A reset circuit is connected in a feedback circuit with the delay circuit. It resets a high-voltage device in response to the internal reset signal, and generates a reset completion signal when the high voltage device is reset.

13 Claims, 2 Drawing Sheets

INTERNAL RESET SIGNAL GENERATOR FOR USE IN SEMICONDUCTOR MEMORY

CROSS REFERENCE TO RELATED APPLICATIONS

This application claims priority from Korean Patent Application No. 2004-35842, filed on May 20, 2004. The entire content of Korean Patent Application No. 2004-35842 is hereby incorporated herein by reference.

BACKGROUND

1. Field of the Invention

This disclosure relates to a semiconductor memory devices, and more particularly to power supply circuitry associated with semiconductor memory devices.

2. Description of the Related Art

In some semiconductor memory devices an externally supplied high voltage is converted into a low internal voltage. A semiconductor device such as Metal-Oxide Semiconductor (MOS) transistor can operate with a low threshold voltage and high-speed or with a high-threshold voltage and a low-speed operation. In some cases, where reliability is important, a high-voltage and a low-speed operation is used.

To begin the operation of a semiconductor memory device, a power up voltage is applied. Some circuits may not respond immediately when the power up voltage is first applied and they may only operate after the power source voltage rises to a predetermined level. This delay can cause unstable operation at power-up time. Unstable operation may involve indecision between logic 'high' and a logical 'low' states. Instability can be caused at power up time if circuitry in a memory device is reset before the power source for the memory has completely stabilized.

An internal reset signal generator can be used to generate an internal reset signal when the power source voltage has stabilized to a predetermined value. This can prevent instability and false signals.

FIG. 1 is a circuit diagram of a prior art internal reset signal generator. The internal rest signal generator shown in FIG. 1 includes a voltage divider 10 for dividing a power source voltage into a predetermined divided voltage, a detector circuit 20 for detecting and amplifying the divided voltage, and a buffer circuit 30 for shaping the output of the detector 20 and outputting control signals.

The voltage divider 10 includes PMOS transistors P11 and P12 connected in series between power source voltage Vdd and node N10. The transistors P11 and P12 are connected to form a diode structure, and a resistance element R10 is connected between the node N10 and ground voltage. The voltage divider 10 divides the power source voltage Vdd into a predetermined voltage and outputs the predetermined voltage to the node N10.

The detector circuit 20 includes an inverter circuit that has, as a common gate input, the output node N11. The detector circuit 20 includes PMOS transistors P21 and P22 and NMOS transistors N21 and N22 connected in series between power source Vdd and ground voltage. The buffer circuit 30 includes an inverter for buffering an output of the detector circuit 20.

The internal reset signal generator shown in FIG. 1 operates as follows: When power Vdd is initially supplied, the power source voltage Vdd rises gradually. As the power source voltage Vdd gradually increases, the voltage of the node N10 rises until it reaches the predetermined voltage established by the voltage division provided by PMOS transistors P11 and P12 and the resistance element R10.

The voltage level of the node N10 maintains a logic 'low' state until the power source voltage Vdd becomes stabilized at a predetermined level. The PMOS transistors P21 and P22 are turned on by the voltage at node N10 and the detector circuit 20 outputs a logic 'high' signal. An output signal from the detector circuit 20 is inputted to the buffer circuit 30 and is shaped through by the inverter in the buffer circuit 30, to generate reset signal PVCCH. A reset of internal elements is accomplished by the reset signal PVCCH.

When the voltage of node N10 rises to the threshold voltage of NMOS transistors N21 and N22, that is, when the voltage of note N10 rises to the trip voltage, NMOS transistors N21 and N22 operate, the detector circuit 20 inverts a level state of the node N10, and the circuit outputs a logic 'low' signal.

The logic 'low' signal outputted by detector circuit 20 is inputted to the buffer circuit 30 and is shaped by the inverter in the buffer circuit 30. It generates an internal reset disable signal PVCCH. The reset of internal elements is completed by the internal disable signal PVCCH, and a normal operation is performed.

Such a prior art internal reset signal generator is configured so that when the internal reset signal is generated, all of the circuits requiring an internal reset operation are reset, and then, a reset disable signal is generated.

It is noted that the combination of an internal reset signal and an internal reset disable signal may be considered to be "one signal" that has a logic 'high' level and a logic 'low' level. Herein, the reset signal and the reset disable signals are described and discussed as being two different and separate signals. Describing the signals in this manner is merely done for convenient in describing and understanding the present invention. Those skilled in the art will understand that the reset signal and reset disable could alternatively be described as being one signal having two periods of different voltage levels.

As the internal operating voltages of devices becomes lower, the voltage difference between a device operating at a high-speed and low-voltage and a device operating at a low-speed and high-voltage becomes greater. Furthermore, in an internal reset signal generator that use an internal power source voltage with no externally supplied voltage, in general, the internal power source voltage cannot reach a value significantly greater than the threshold voltage of an MOS transistor which operates as a high voltage device.

The threshold voltage of a MOS transistor is affected by many variables such as a process condition, temperature, etc. Variations in threshold voltage may cause problems in generating the internal reset disable signal and circuits that employ a high voltage device may not be completely reset. This may cause errors in the operation of a semiconductor memory using such a circuit.

SUMMARY

In one embodiment, the present invention provides an internal reset signal generator for use in a semiconductor memory device, which prevents an internal reset signal from being disabled prior to a desired time period. The generator substantially reduces or prevents errors in operation of a semiconductor memory and stabilizes the operation of such a memory.

The internal reset signal generator of the present invention includes an internal high voltage device that is reset by the reset signal. A disable reset signal is only generated after the internal high voltage device has been successfully reset.

BRIEF DESCRIPTION OF THE DRAWINGS

The above and other features of exemplary embodiments of the invention will become readily apparent from the description that follows, with reference to the attached drawings in which.

DETAILED DESCRIPTION

Exemplary embodiments of the invention are more fully described below with reference to FIGS. 2 and 3. The invention may be embodied in many different forms and should not be construed as being limited to the exemplary embodiments set forth herein. Rather, these exemplary embodiments are provided so that this disclosure is thorough and complete, and to convey the concept of the invention to those skilled in the art.

Herein, the reset signal and the reset disable signals are described as being two different and separate signals. It is noted that the sequence of an internal reset signal and an internal reset disable signal may be considered to be "one signal" that has a logic 'high' level followed by a logic 'low' level. Describing these signals as two separate and distinct signals is merely done for convenience in describing and understanding the exemplary embodiments of the invention. Those skilled in the art will understand that the reset signal and reset disable could alternatively be described as one signal having two periods of different voltage levels.

Figure 1:
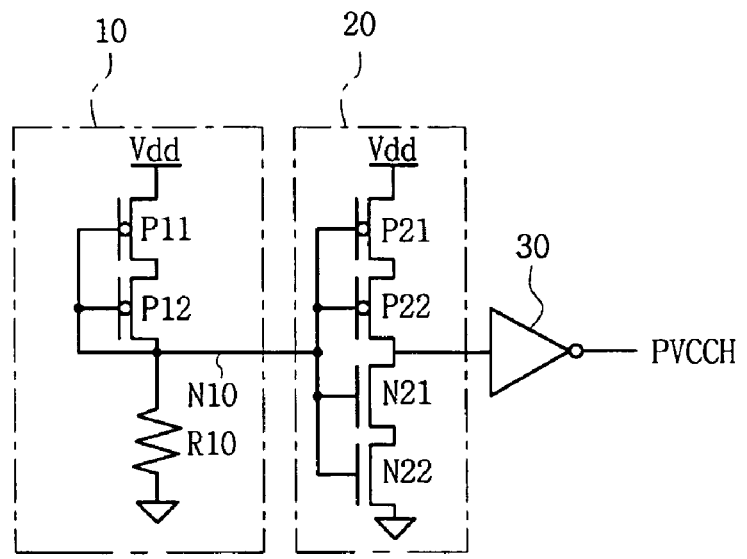
FIG. 1 is a circuit diagram of a prior art internal reset signal generator.
Figure 2:
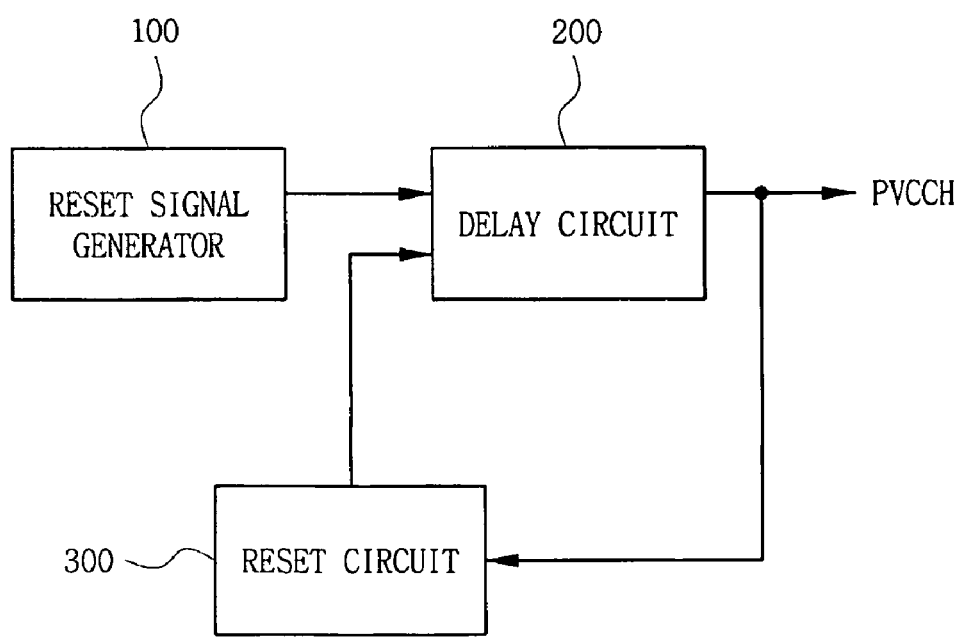
FIG. 2 is a block diagram of internal reset signal generator according to an exemplary embodiment of the present invention.

FIG. 2 is a block diagram of internal reset signal generator according to an exemplary embodiment of the invention. As shown in FIG. 2, the internal reset signal generator includes a reset signal generator 100, a delay circuit 200 and a reset circuit 300.

The reset signal generator 100 divides and amplifies a power source voltage when power is initially supplied. The reset signal generator 100 outputs a first control signal until the power source voltage reaches a stabilized state, and thereafter it outputs a second control signal.

The delay circuit 200 generates an output signal in response to first and second control signals outputted from the reset signal generator 100 and a control signal applied from the reset circuit 300. When the first control signal is applied from the reset signal generator 100, and a reset completion control signal is not applied from the reset circuit 300, the delay circuit 200 only generates an internal reset signal PVCCH even if the second control signal is applied from the reset signal generator 100. When a second control signal is applied form the reset signal generator 100 and a reset completion signal is applied from the reset circuit 300, the delay circuit 200 generates an internal reset disable signal PVCCH.

The reset circuit 300 models a circuit employing a high-voltage device having a high threshold voltage. The reset circuit 300 forms a feedback circuit together with delay circuit 200. The reset circuit 300 resets a high-voltage device having a high threshold voltage in response to the internal reset signal PVCCH, and it outputs a reset completion signal which is sent to the delay circuit 200.

With this circuit the internal reset disable signal PVCCH is not generated until the reset operation of the high voltage device is completed (by reset circuit 300). Thus, the device operates satisfactorily even for devices with a high threshold voltage, thereby preventing or reducing errors in operation of a semiconductor memory device that includes the circuit.

Figure 3:
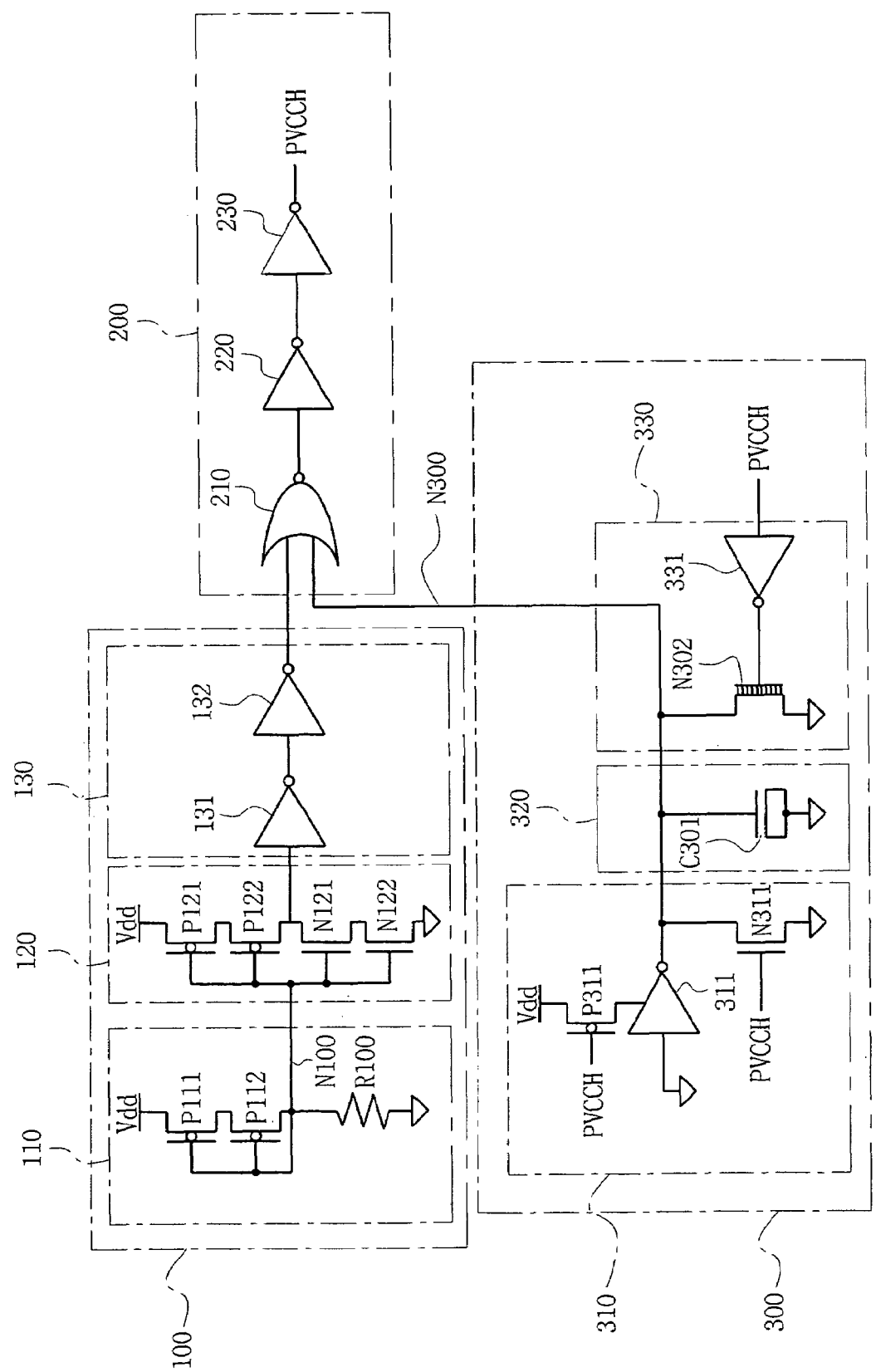
FIG. 3 is a logical circuit diagram of the circuit shown in FIG. 2.

FIG. 3 is a logical circuit diagram of the internal reset signal generator shown in FIG. 2. As shown by the dotted boxes in FIG. 3, the circuit includes a reset signal generator 100, a reset circuit 300 and a delay circuit 200 as shown in FIG. 2.

The reset signal generator 100 includes a voltage divider 110 for dividing a power source voltage into a predetermined voltage, a detector circuit 120 for detecting and amplifying the divided voltage, and a buffer circuit 130 for shaping the output signal of the detector circuit 120 and outputting control signals. Thus, in terms of its overall construction the reset signal generator 100 is somewhat similar to a conventional internal reset signal generator.

The voltage divider 110 includes MOS transistors P111 and P112 that are diode-connected in series between a power source voltage Vdd and an output node N100. A resistance element is connected between the output node N100 and a ground voltage.

In the example illustrated, the voltage divider 110 is constructed of PMOS transistors P111 and P112 connected in series between power source voltage Vdd and output node N100 by a diode structure, and a resistance element R100 connected between the node N100 and a ground voltage. The voltage divider 110 divides the power source voltage Vdd into a predetermined voltage and outputs it to the output node N100. In the example described here the power source voltage Vdd is 1.8V, the voltage divider 110 is arranged so that the voltage of the output node becomes about 1.2V.

The detector circuit 120 includes an inverter circuit that has, as an input, the output node N100 of the voltage divider 110.

In the example shown, the detector circuit 120 includes PMOS transistors P121 and P122 which have, as a common gate input, the output node N100. PMOS transistors P121 and P122 are connected in series between the power source voltage and the NMOS transistors. The circuit also includes NMOS transistors N121 and N122. The NMOS transistors N121 and N122 have as a common gate input, the output node N100 and they are connected between the PMOS transistors P121 and P122 and a ground voltage. It is noted that other embodiments have different numbers of PMOS and NMOS transistors in a similar configuration. However, the number of NMOS transistors equals the number of PMOS transistors.

In the example illustrated herein, the buffer circuit 130 inverters 131 and 132 for shaping and buffering an output signal of the detector circuit 120. The buffer circuit 130 shapes and buffers an output signal of the detector, and outputs first and second control signals. It is noted that other embodiments have one or more inverters in a similar configuration.

The reset circuit 300 together with the delay circuit 200 forms a feedback circuit. The reset circuit 300 includes a high-voltage device block 330 having a high-voltage device to perform a reset operation in response to an internal reset signal. This circuit outputs a reset completion signal when the reset operation is completed. A capacitor block 320 has a capacitor to prevent a too rapid transition of the level of the output signal of the reset circuit 300. A latch block 310 fixes the output signal of the reset circuit 300 in response to the internal reset disable signal PVCCH.

The high-voltage device in the high-voltage device block 330 may be a MOS transistor that has a high threshold voltage and that operates at high voltage. For example, the high voltage device may be constructed of an NMOS transistor N302 that is connected between output node N300 of the reset circuit 300 and a ground voltage and that operates in response to an internal reset signal PVCCH generated in the delay circuit part, progressing a reset operation. The high voltage device is modeled from a device that is reset latest in a general semiconductor memory device. It is noted that other semiconductor devices can be used in place of the specific MOS transistor described above.

The capacitor in the capacitor block 320 may be an NMOS transistor C301 whose source and drain are connected with each other and to ground. The gate of the transistor is connected to an output node N300 of the reset circuit 300 as illustrated in FIG. 3.

The latch block 310 includes an inverter 311 and an NMOS transistor N311. The inverter 311 operates in response to the internal reset signal PVCCH. It receives a ground voltage and applies an output signal to the output node N300 of the reset circuit 300. The NMOS transistor N311 is connected between the output node N300 and the ground voltage. It operates in response to an internal reset disable signal PVCCH from the delay circuit 200.

The delay circuit 200 generates an internal reset disable signal PVCCH only when a reset completion signal from the reset circuit 300 and a second control signal of the reset signal generator 100 are inputted simultaneously. If these two signals are not simultaneously present it maintains the internal reset signal PVCCH. The inverter circuit is constructed of at least one inverter for shaping and buffering an output signal of the logic circuit and then for generating an internal reset signal PVCCH and an internal reset disable signal PVCCH. As shown in FIG. 3 the delay circuit 200 includes a logic NOR circuit 210 and at least one or more inverters 220 and 230. The logic NOR circuit 210 outputs a logic 'high' signal only when the reset completion signal and the second control signal are inputted simultaneously, and in other cases, outputs a logic 'low' signal. The inverters 220 and 230 shape and buffer the output signal of the logic NOR circuit 210 and generate an internal reset signal PVCCH and an internal reset enable signal.

The internal reset signal generator shown in FIG. 3 operates as follows: When power source voltage Vdd is supplied first, the level of the power source voltage Vdd rises gradually. As the power source voltage Vdd gradually increases, the voltage at the output node N100 rises through the diode-connected PMOS transistors P111 and P112, and the voltage level of the output node N100 continuously rises until it reaches a predetermined voltage determined by the voltage division through the PMOS transistors P111 and P112 and the resistance element R100.

Thus, the voltage level of the output node N100 maintains a logic 'low' state until the power source voltage Vdd becomes stabilized at a predetermined level. The PMOS transistors P121 and P122 in the detector circuit 120 are turned on by the voltage level of the node N100. Thus, the detector circuit 120 outputs a logic 'high' signal. The output signal of the detector circuit 120 is inputted to the buffer circuit 130 and is shaped and buffered through inverters 131 and 132, and the buffer circuit 130 outputs a first control signal as a logic 'high' signal.

By maintaining a logic 'high' state of the first control signal, the logic NOR circuit 210 of the delay circuit 200 outputs a logic 'low' signal. The logic 'low' signal did not output from the logic NOR circuit 210 is buffered by the inverters 220 and 230, and is outputted as an internal reset signal PVCCH.

The internal reset signal PVCCH generated by the delay circuit 200 resets circuit requiring an internal reset operation. Further, the internal reset signal PVCCH is inputted to the reset circuit 300.

The internal reset signal PVCCH inputted to the reset circuit 300 resets an NMOS transistor N302 through an inverter 331. The transistor N302 is a high-voltage device having high threshold voltage. The internal reset signal PVCCH operates PMOS transistor P301 so that inverter 311 that is the latch block 310 can operate, to supply power source voltage. The output node N300 of the reset circuit 300 maintains a logic 'high' state through operation of the inverter 311 until a reset operation of the high-voltage MOS transistor N302 is completed and the high-voltage MOS transistor N302 is turned on.

By maintaining a logic 'high' state at the output node N300 of the reset circuit 300, the delay circuit 200 continuously generates the internal reset signal PVCCH. Such a state is continued, even after a second control signal as a logic 'low' signal is outputted through the detector circuit 120 and the buffer circuit 130. Thus as the power source voltage Vdd continuously rises, the voltage of output node N100 of the voltage divider 110 rises to a trip voltage that operates NMOS transistors N121 and N122 constituting the detector circuit 120.

When the NMOS transistor N302, which is a high-voltage device, is completely reset and turned on, the output node N300 of the reset circuit 300 becomes a logic 'low' state. When the output node N300 arrives at a logic 'low' state and a second control signal is output from the reset signal generator 100, an internal reset disable signal PVCCH is generated. The internal reset disable signal PVCCH is a logic 'high' signal that has a logic level opposite to that of the internal reset signal.

When the internal reset disable signal PVCCH is generated, the reset operation of the internal circuit is stopped, and the NMOS transistor N302 is turned off, and the logic level of the output node N300 is fixed to a 'low' state by the latch block 310. That is, a PMOS transistor P311 of the latch block 310 is turned off, thus a DC path is removed and the operation of inverter 311 is stopped. The output node N300 is maintained as a logic 'low' state without floating NMOS transistor N311.

In the configuration described above, even if there is a circuit operating at a high voltage, an internal reset disable signal is generated after an internal reset operation is completed, thereby preventing or substantially reducing errors in operation of semiconductor memory devices.

With the exemplary embodiment of the invention described above, the internal reset signal can be prevented from being disabled more quickly than is required. This can prevent or at least substantially reduce errors in the operation of semiconductor memory devices.

The present invention may be embodied and practiced in many ways. What follows is an exemplary, non-limiting description of some embodiments of the invention.

In one exemplary embodiment of the invention, an internal reset signal generator for use in a semiconductor memory device comprises a first circuit for dividing and amplifying a power source voltage when power is initially supplied. A first control signal is outputted until the power source voltage reaches a stabilized state, and thereafter a second control signal is generated. A reset circuit generates a reset complete signal. A delay circuit responds to the first and second control signals and to the reset complete signal and generates an internal reset disable signal. The reset disable signal is only generated when the second control signal and the reset completion signal are inputted simultaneously. If the two signals are not simultaneously present the circuit continues to generate the internal reset signal. The reset circuit arranged in a feed back loop with the delay circuit. The reset circuit resets an optional high-voltage device in response to the internal reset signal generated the delay circuit. It applies a reset completion signal to the delay circuit to complete the reset operation.

The reset signal generator may include a voltage divider for dividing power source voltage into a predetermined voltage, a detector circuit for detecting and amplifying a level of the divided voltage, and a buffer circuit for shaping an output signal of the detector circuit and outputting the first and second control signals.

The reset circuit includes a high-voltage device block that has a high-voltage device which performs a reset operation in response to the internal reset signal generated by the delay circuit. The reset circuit outputs a reset completion signal when the reset operation is completed. A capacitor block in the reset circuit has a capacitor to prevent a too rapid transition of the output signal from the reset circuit. The reset circuit also includes a latch block for fixing the output signal of the reset circuit in response to the internal reset disable signal.

The delay circuit may include a logic circuit for generating an internal reset disable signal only when the reset completion signal and the second control signal are inputted simultaneously. If the two signals are not simultaneously present a signal the internal reset signal is maintained. The delay circuit includes an inverter circuit with at least one inverter for shaping and buffering an output signal of the logic circuit and for generating an internal reset signal and an internal reset disable signal.

With this invention errors in operation of a semiconductor memory device can be prevented or substantially reduced. Errors are reduced by generating an internal reset disable signal after an internal reset operation is completed.

It will be apparent to those skilled in the art that modifications and variations can be made in the present invention without deviating from the spirit or scope of the invention. Thus, it is intended that the present invention cover any such modifications and variations of this invention provided they come within the scope of the appended claims and their equivalents. For example, logic levels of respective nodes and output signals may be changed, and internal configuration or elements of circuits can be changed or replaced by other equivalent elements. Accordingly, these and other changes and modifications are seen to be within the true spirit and scope of the invention as defined by the appended claims.

The invention claimed is:

1. An internal reset signal generator for use in a semiconductor memory device, said internal reset signal generator is configured to be supplied with a power source voltage, when applied said power source voltage reaching a stable state after a period of time, said internal reset signal generator comprising:
   a first circuit adapted to divide a power source voltage and to amplify said power source voltage when said power source voltage is first supplied, said first circuit is configured to output a first control signal until said power source voltage reaches said stable state, and is configured to output a second control signal when said power source voltage reaches said stable state;
   a delay circuit adapted to generate an internal reset signal and an internal reset disable signal,
   a reset circuit adapted to generate a reset completion signal, said delay circuit and said reset circuit being connected in a feedback loop,
   said delay circuit is configured to be responsive to said first and second control signals outputted from said first circuit and to said reset completing signal from said reset circuit, said delay circuit is configured to generate said internal reset disable signal only when the second control signal and a reset completion signal from said reset circuit are inputted simultaneously, and in other cases, is configured to generate said internal reset signal;
   said reset circuit including a resettable high voltage device having a high threshold voltage, said reset circuit is configured to reset said high-voltage device in response to said internal reset signal generated by said delay circuit and is configured to generate a reset completion signal only when said high voltage device is reset.

2. The generator of claim 1, wherein said first circuit comprises:
   a voltage divider for dividing said power source voltage into a predetermined voltage;
   a detector circuit for detecting and amplifying the level of said divided voltage; and
   a buffer circuit for shaping an output signal of the detector circuit and outputting the first and second control signals.

3. The generator of claim 2, wherein the voltage divider comprises:
   at least one MOS (Metal Oxide Semiconductor) transistor connected in series between a power source voltage and an output node in a diode configuration; and
   a resistance element connected between the output node and the ground voltage.

4. The generator of claim 3, wherein the detector circuit comprises:
   at least one PMOS transistor, which has, as a common gate, the output node of said voltage divider and which is connected in series between said power source voltage and an NMOS transistor; and
   the same number of NMOS transistors as the number of the PMOS transistors, which have, as a common gate input, the output node, and which are connected in series between the PMOS transistors and the ground voltage.

5. The generator of claim 4, wherein the buffer circuit comprises at least one or more inverters for shaping and buffering an output signal of the detector circuit.

6. The generator of claim 5, wherein the first control signal has a first logic state, and the second control signal has a second logic state opposite to the first logic state.

7. The generator of claim 6, wherein the first logic state designates a logic 'high' state and the second logic state designates a logic 'low' state.

8. An internal reset signal generator for use in a semiconductor memory device, said internal reset signal generator is configured to be supplied with a power source voltage, when applied said power source voltage reaching a stable state after a period of time, said internal reset signal generator comprising:
   a first circuit adapted to divide a power source voltage and to amplify said power source voltage when said power source voltage is first supplied, said first circuit is configured to output a first control signal until said power source voltage reaches said stable state, and is configured to output a second control signal when said power source voltage reaches said stable state;

a delay circuit adapted to generate an internal reset signal and an internal reset disable signal; and a reset circuit adapted to generate a reset completion signal, said delay circuit and said reset circuit being connected in a feedback loop;

said delay circuit is configured to be responsive to said first and second control signals outputted from said first circuit and to said reset completing signal from said reset circuit, said delay circuit is configured to generate said internal reset disable signal only when the second control signal and a reset completion signal from said reset circuit are inputted simultaneously, and in other cases, is configured to generate said internal reset signal;

said reset circuit including a resettable high voltage device, said reset circuit is configured to reset said high-voltage device in response to said internal reset signal generated by said delay circuit and is configured to generate a reset completion signal only when said high voltage device is reset, wherein the reset circuit comprises:

a high-voltage device block having a high-voltage device which is reset in response to an internal reset signal generated in said delay circuit, and which outputs a reset completion signal when the reset operation is completed;

a capacitor block having a capacitor to control a too rapid transition in the level of the output signal of the reset circuit; and a latch block for fixing an output signal of the reset circuit in response to the internal reset disable signal.

9. The generator of claim 8, wherein the high voltage device is a MOS transistor, the MOS transistor being connected between an output node of the reset circuit and a ground voltage and having a threshold voltage, the MOS transistor operating at a high voltage to perform a reset operation by the internal reset signal.

10. The generator of claim 9, wherein the capacitor is constructed of a MOS transistor whose source and drain are connected with each other, one end of the connection being connected to a ground voltage, and whose gate is, as another end of the connection, connected to the output node of the reset circuit part.

11. The generator of claim 8, wherein the latch block comprises:

an inverter circuit, which operates in response to the internal reset signal, receives a ground voltage, and applies an output signal to the output node of the reset circuit; and an NMOS transistor, which is connected between the output node of the reset circuit and the ground voltage, and operates in response to the internal reset disable signal outputted from the delay circuit part.

12. The generator of claim 1, wherein the delay circuit comprises:

a logic circuit for generating the internal reset disable signal only when a reset completion signal of the reset circuit and the second control signal are inputted simultaneously, and in other cases, outputting a signal to maintain the internal reset signal; and an inverter circuit constructed of at least one inverter for shaping and buffering an output signal of the logic circuit and then for generating the internal reset signal and the internal reset disable signal.

13. An internal reset signal generator for use in a semiconductor memory device, said internal reset signal generator is configured to be supplied with a power source voltage, said internal reset signal generator comprising:

first means for dividing a power source voltage and amplifying it when a power source voltage is first supplied, and for outputting a first control signal until said power source voltage reaches a stabilized state, and for outputting a second control signal when said power source voltage reaches the stabilized state;

second means for generating an internal reset signal and an internal reset disable signal;

third means for generating a reset completion signal, said second and third means being connected in a feedback loop;

said second means being responsive to said first and second control signals and to said reset completion signal and is configured to generate said internal reset disable signal only when the second control signal and said reset completion signal are inputted simultaneously, and in other cases, is configured to generate said internal reset signal; and said third means including a resettable high voltage device having a high threshold voltage, said third means is configured to reset said high-voltage device in response to an internal reset signal and is configured to generate a reset completion signal only when said high voltage device has been completely reset.

* * * * *

UNITED STATES PATENT AND TRADEMARK OFFICE
CERTIFICATE OF CORRECTION

PATENT NO. : 7,248,085 B2 Page 1 of 1
APPLICATION NO. : 11/131663
DATED : July 24, 2007
INVENTOR(S) : Won-Chang Jung It is certified that error appears in the above-identified patent and that said Letters Patent is hereby corrected as shown below:

Column 1, line 57, the word "N11" should read -- N10 --;
Column 9, line 17, the word "arc" should read -- are --.

Signed and Sealed this

Twelfth Day of August, 2008

JON W. DUDAS
*Director of the United States Patent and Trademark Office*